United States Patent [19]
Siegele et al.

[11] Patent Number: 6,029,717
[45] Date of Patent: Feb. 29, 2000

[54] HIGH ASPECT RATIO CONTAINERS FOR ULTRAHIGH PURITY CHEMICALS

[75] Inventors: Stephen H. Siegele, Austin; John N. Gregg, Marble Falls, both of Tex.; Craig M. Noah, Mountain View, Calif.

[73] Assignee: Advanced Delivery & Chemical Systems, Ltd., Austin, Tex.

[21] Appl. No.: 08/756,146

[22] Filed: Nov. 29, 1996

Related U.S. Application Data

[63] Continuation-in-part of application No. 08/485,968, Jun. 7, 1995, Pat. No. 5,711,354, which is a continuation of application No. 08/345,244, Nov. 24, 1994, Pat. No. 5,607,002, which is a continuation-in-part of application No. 08/184,226, Jan. 19, 1994, abandoned, which is a continuation-in-part of application No. 08/054,597, Apr. 28, 1993, Pat. No. 5,465,766.

[51] Int. Cl.⁷ ..................................................... F17C 13/00
[52] U.S. Cl. ........................ 141/198; 141/95; 141/21; 220/612
[58] Field of Search .................... 141/21, 67, 95, 141/198; 137/208, 209, 412; 73/308, 311, 313, 319, DIG. 5; 340/623, 624; 200/84 C; 220/612

[56] References Cited

U.S. PATENT DOCUMENTS

| | | | |
|---|---|---|---|
| 2,160,062 | 5/1939 | Drake et al. ............................ 23/290 |
| 2,536,273 | 1/1951 | Gahagan ................................ 200/84 |
| 2,777,914 | 1/1957 | Brown .................................. 200/84 |
| 3,081,905 | 3/1963 | Schulze et al. ....................... 220/612 |
| 3,731,805 | 5/1973 | Schniers .................................. 210/86 |
| 3,826,139 | 7/1974 | Bachman .................................. 73/311 |
| 3,930,591 | 1/1976 | Hawerkamp ........................... 220/612 |
| 4,056,979 | 11/1977 | Bongort et al. ........................ 73/313 |
| 4,064,755 | 12/1977 | Bongort et al. ........................ 73/313 |
| 4,134,514 | 1/1979 | Schumacher et al. ................... 220/85 |
| 4,298,037 | 11/1981 | Schumacher et al. .................... 141/1 |
| 4,425,949 | 1/1984 | Rowe, Jr. ................................. 141/1 |
| 4,436,674 | 3/1984 | McMenamin et al. ................. 261/64 |
| 4,576,552 | 3/1986 | Smith ..................................... 417/2 |
| 4,676,404 | 6/1987 | Yamazaki et al. ...................... 222/56 |
| 4,859,375 | 8/1989 | Lipisko et al. ........................... 261/20 |
| 4,976,146 | 12/1990 | Senghass et al. ....................... 73/313 |
| 4,979,545 | 12/1990 | Fair ......................................... 141/83 |
| 4,979,643 | 12/1990 | Lipisko et al. ........................... 222/83 |
| 5,038,840 | 8/1991 | Fair ......................................... 141/83 |
| 5,041,267 | 8/1991 | Randtke et al. ....................... 422/102 |
| 5,069,244 | 12/1991 | Miyazaki et al. ..................... 137/209 |
| 5,079,950 | 1/1992 | McKieman et al. ..................... 73/313 |
| 5,090,212 | 2/1992 | Keltner et al. ....................... 200/84 X |
| 5,103,673 | 4/1992 | Sawada et al. .......................... 73/313 |
| 5,137,063 | 8/1992 | Foster et al. ............................ 141/98 |
| 5,148,945 | 9/1992 | Gaetz ...................................... 222/1 |
| 5,285,812 | 2/1994 | Morales ................................ 137/393 |
| 5,329,963 | 7/1994 | Jones et al. ............................. 141/6 |
| 5,465,766 | 11/1995 | Siegele et al. ........................ 141/198 |
| 5,479,959 | 1/1996 | Stotelmyer et al. ................... 137/559 |
| 5,562,132 | 10/1996 | Siegele et al. ........................ 141/198 |
| 5,590,695 | 1/1997 | Siegele et al. .......................... 141/21 |
| 5,607,002 | 3/1997 | Siegele et al. ........................ 141/198 |
| 5,628,342 | 5/1997 | McNealy et al. ...................... 220/612 |
| 5,676,180 | 10/1997 | Teel ....................................... 141/18 |

FOREIGN PATENT DOCUMENTS 1036717  8/1958  Germany .

OTHER PUBLICATIONS

B/W Unifloat® Liquid Level Control systems, New single float/multiple switch level sensing system provides versatile, reliable means of controlling any type of liquid, Brochure by B/W Controls Inc.

Transfil™, *Chemical Refill System*, Brochure by Air Products and Chemicals, Inc. Aug. 1991 Rev. 1, Schumacher.

Announcing A New Era In Liquid Chemical Delivery, Transfil II™, Product Brochure by Schumacher (Apr. 1990).,

*Primary Examiner*—J. Casimer Jacyna
*Attorney, Agent, or Firm*—O'Keefe, Egan & Peterman

[57] ABSTRACT

Containers for ultrahigh purity chemicals having aspect ratios of greater than 3:1 and methods of making the same from seamless electropolished stainless steel tubing are described. Chemical delivery systems for semiconductor fabrication processes that utilize these high aspect ratio containers also are described.

12 Claims, 3 Drawing Sheets

HIGH ASPECT RATIO CONTAINERS FOR ULTRAHIGH PURITY CHEMICALS

This application is a continuation-in-part of application Ser. No. 08/485,968, filed Jun. 7, 1995, now U.S. Pat. No. 5,711,354; which is a continuation of Ser. No. 08/345,244, filed Nov. 24, 1994, now U.S. Pat. No. 5,607,002; which is a continuation-in-part of Ser. No. 08/184,226, filed Jan. 19, 1994, now abandoned, which is a continuation-in-part of Ser. No. 08/054,597, filed Apr. 28, 1993, now U.S. Pat. No. 5,465,766.

TECHNICAL FIELD

The present invention relates to containers for ultrahigh purity chemicals having aspect ratios of between 3:1 and 6:1 and methods of making the same. The present invention also relates to the use of these high aspect ratio containers in chemical delivery systems for semiconductor fabrication processes.

BACKGROUND

Ultrahigh purity chemicals are used as source chemicals in Chemical Vapor Deposition (CVD) processes. Three methods currently are utilized for delivering the chemical to the process chamber. One of these methods is known as direct liquid injection.

Direct liquid injections systems typically employ liquid (or mass) flow control systems that are sensitive to the presence of dissolved gases in the liquid CVD source chemical. These liquid flow controllers are necessary to deliver precise quantities of the source chemical to the process tool. The sensitivity of these devices is a result of the thermodynamic operating principal of typical liquid flow controllers and can be better understood by a description of the operation of such a device.

A typical liquid flow controller has a precision power supply that directs heat to the midpoint of a sensor tube which is carrying a constant percentage of the flow to be measured. On the same sensor tube, temperature measuring elements are placed equidistant upstream and downstream of the heat input. If no liquid or gas is flowing in the sensor tube, the heat reaching each temperature element is equal. However, with increasing flow, the flow stream carries heat away from the upstream element toward the downstream element. An increasing temperature difference develops between the two temperature measuring elements and this temperature difference is proportional to the liquid or gas flow rate.

If the liquid flow being measured is devoid of dissolved gases, a thermodynamic mass flow controller can accurately detect the amount of liquid flowing through the sensor tube. For typical CVD systems, mass flow is monitored in the vapor phase and is not sensitive to dissolved gases. However, in direct liquid injection applications, inert gases, such as helium and nitrogen, are used to pressurize CVD chemical source canisters to force the chemical contents out of the container to the process tool. Therefore, dissolved gases may be present in chemicals dispensed under pressure from ultrahigh chemical containers.

As a result of this thermodynamic operating principle, liquid flow controllers are very sensitive to gas bubbles being present in the liquid stream, because the heat capacity of the inert gas is considerably less than the liquid being transferred. If gas bubbles are, in fact, present in the liquid stream, the liquid flow controller will experience a period of instability in which improper amounts of liquid are delivered to the process tool. If this instability occurs, film deposition non-uniformities on the IC being manufactured can result and may lead to the fabrication of defective ICs. Therefore, it would be desirable to design a direct liquid injection system that minimizes dissolved gases in the liquid stream.

Novellus Systems, the first CVD process tool manufacturer to adopt direct liquid injection for tetraethylorthosilicate (TEOS) based CVD processes, dealt with the dissolved helium pressurizing gas problem by periodically "degassing" the source chemical container. The degassing procedure consists of evacuating the helium pressurizing gas from the source container and maintaining a vacuum in the container for a period of time to remove dissolved helium from the source chemical. However, this procedure adds additional degassing requirements and process delays while the liquid is being degassed. To avoid equipment downtime that results from a degassing step, Novellus also has developed an in-line degassing apparatus that eliminates the need to pull a vacuum on the source chemical container. Thus, this system requires an additional degassing module.

More recently, Applied Materials, another CVD process tool manufacturer, imposed a minimum distance from the surface of the liquid chemical to the bottom of the dip tube in a 5 gallon CVD chemical source container, because the process tool developed flow instability when the chemical level went lower. It was concluded that a concentration gradient of dissolved helium pressurizing gas would create more serious flow instability problems as the gas liquid interface approached the bottom of the container. The minimum distance established in the chemical container was at a level equivalent to 40% of the container volume.

Many process tools require the use of triethyl phosphate (TEPO), triethyl borate (TEB) and other ultrahigh purity chemicals in very low volume. The delivery conditions described above create unacceptable conditions for the five gallon containers traditionally used, as all of the chemical may not be consumed before the shelf life of the chemical is exceeded.

SUMMARY

In order to minimize dissolved gases in high purity chemicals being delivered by direct liquid injection techniques, high aspect ratio containers have been developed. The height-to-diameter ratio of these containers is at least about 3:1 to 6:1 and is preferably about 5:1. These high aspect ratio containers are designed to minimize the surface area of the liquid that is subject to gas contact and provide the advantageous feature of reducing the gas dissolution rate into the chemical. Preferably, the volume of high purity chemical in the present containers is maintained at at least 40% of the container level to further minimize the amount of dissolved gas in the chemical. More preferably, the volume of chemical is maintained at or above 50% of the container volume. High aspect ratio containers also minimize the floorspace necessary to store a given volume of high purity chemical.

The present high aspect ratio containers are fabricated from a section of seamless 316L electropolished (EP) stainless steel (SS) tubing. Milled 316L EP SS end caps are welded to each end of the seamless tubing. The top end cap has 316L tube stubs to weld inlet, outlet and refill valves to the container. A level sensor fitting also is welded onto the container before electropolishing.

These high aspect ratio containers are preferably used to store and/or dispense high purity chemicals that are utilized in semiconductor fabrication processes. These high purity chemicals include TEOS, TEB, TEPO, TMB and TMP. Preferably, one gallon canisters constructed according to the present invention are used to store and/or dispense these chemicals, although the present teachings may be used to construct canisters of volumes from one liter to ten gallons.

The invention containers may be used as "bulk" containers, as "process" containers or as both. A bulk container typically stores larger volumes of high purity chemical and is cleaned and refilled by the chemical manufacturer. The bulk container can be located either in a cabinet with a process container or in a remote chemical cabinet and dispenses high purity chemical to a process container.

The process container may be located close to the semiconductor fabrication equipment (process tool), such as a CVD reactor, and stores the high purity chemical for delivery to the process tool. Typically, the process container is refilled with chemical from the bulk container when a "refill" sensor is activated. Preferably, the process container is refilled when the container volume reaches 50%. The present high aspect ratio containers can be utilized as bulk containers for chemicals used in small volumes, as process containers for most applications or as bulk and process containers in the same system.

Therefore, one object of the present invention is to provide high aspect ratio containers for ultrahigh purity chemicals.

A second object is to provide a direct liquid injection system for high purity chemicals that minimizes dissolved gases in the liquid being delivered from the container to the process tool.

A third object is to provide a container for high purity chemicals that minimizes floorspace requirements.

A fourth object is to provide reduced volume process canisters for low usage semiconductor fabrication applications.

Other objects will be apparent to those skilled in the art from the following description, figures and claims.

DETAILED DESCRIPTION OF THE EMBODIMENTS

To meet low volume use requirements for many semiconductor fabrication applications, high aspect ratio containers have been designed that minimize dissolved gases in chemicals delivered to a semiconductor process tool via direct liquid injection techniques. The resulting container design possesses a unique height-to-diameter aspect ratio of greater than 3:1. Such an aspect ratio makes a chemical container inherently unstable and prone to being tipped over, but this design is necessary to enable the volume of the container to be useful as a low volume CVD source chemical container. For example, a one gallon high aspect ratio source chemical container has been constructed which measures 20.6 in. height×4.0 in. diameter. Conventional CVD chemical source container dimensions are presented in table 1 for comparison.

TABLE 1

Conventional CVD Source Chemical Container Dimensions

| Container Volume | Container Height (in.) | Container Diameter (in.) | Height-to-Diameter Aspect Ratio |
|---|---|---|---|
| 1.3 liter | 5.56 | 5.50 | 1.11 |
| 2.3 liter | 5.63 | 6.50 | 0.866 |
| 1 gal. | 7.25 | 9.15 | 0.792 |
| 2 gal. | 10.37 | 9.15 | 1.13 |
| 5 gal. | 21.3 | 9.15 | 2.33 |
| 10 gal. | 24.29 | 12.0 | 2.02 |

Figure 1:
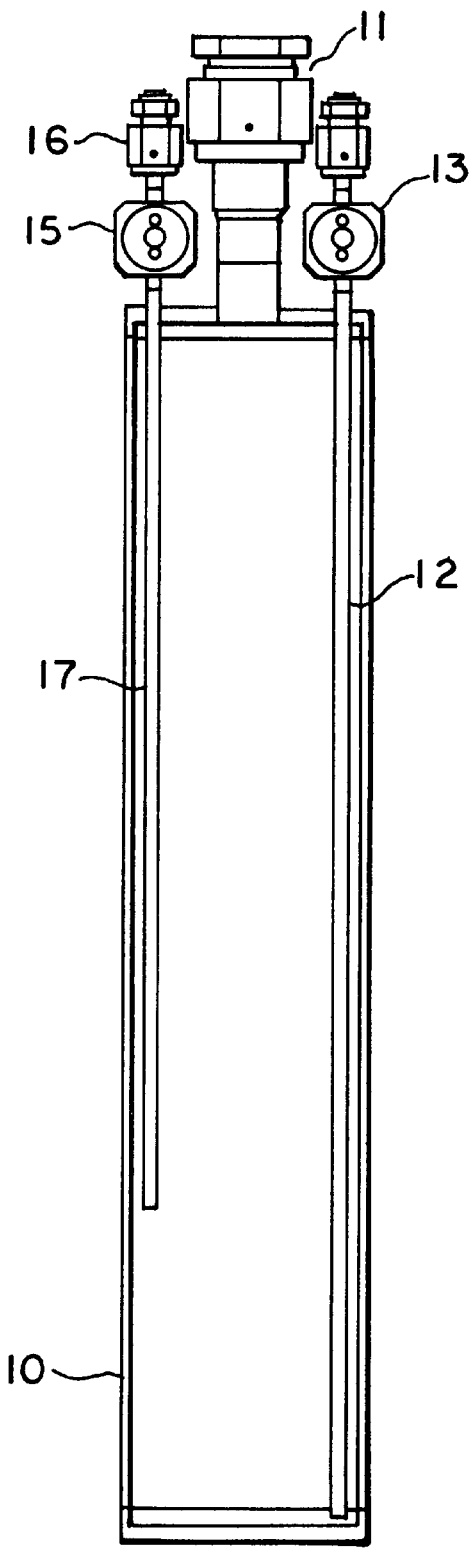
FIG. 1 shows a high aspect ratio container constructed according to the present invention.

Preferably, these high aspect ratio containers are part of a canister for pressure delivery of high purity chemicals to a semiconductor fabrication process tool. Referring to FIG. 1, the container (10) has an inlet valve (11) connected to the top portion of the container which communicates an inert gas, such as helium or nitrogen, under pressure to the contents of the container (10). The gas pressure inside of the container (10) pushes the liquid chemical up through a draw tube (12) that extends nearly to the bottom of the container (10). The draw tube (12) is connected to an outlet valve (13) which communicates the chemical either to a process canister or to a process tool. The container (10) also may have a level sensor (not shown) present to detect when the liquid chemical has dropped below a predetermined container volume. The designer may set the level sensor to trigger at a variety of volumes depending upon the application. In order to minimize dissolved gases in the high purity liquid chemical, preferably a "refill" signal is initiated at about 40%, or more preferably 50%, of the canister volume. This refill signal serves as a indicator that the canister is ready to be refilled. A refill valve and port (15, 16) and fill tube (17) also may be incorporated.

The specific height-to-diameter ratio of the invention containers can be modified depending upon the specific design constraints of the chemical delivery system, such as usage rate, floorspace, cabinet space and the particular liquid flow controller being used. Containers having height-to-diameter aspect ratios of about 3:1 to about 6:1 are preferred. Aspect ratios of about 4.5:1 to about 5.5:1 are more preferred and aspect ratios of about 5:1 are most preferred.

One benefit of the one gallon high aspect ratio container (aspect ratio of about 5:1) is that it produces a similar proportionate surface area in contact with the pressurizing gas to volume ratio as a conventional five gallon canister when each canister is at 40% volume. The gas contact surface area to volume ratio of the one gallon high aspect ratio container (20.6 in. height v. 4.0 in. diameter) is 31 sq.in./gal. The gas contact surface area to volume ratio of the five gallon container described in table 1 is 32 sq.in./gal. Preservation of the surface area to volume ratio was a key consideration in the design in order to maintain similar pressurizing gas dissolution rates and chemical delivery characteristics.

Another benefit of the high aspect ratio CVD source chemical container is the gas contact surface area to volume is much less than a conventional container that holds the same volume. For example, the conventional one gallon container referenced in table 1 above has a gas contact surface area-to-volume ratio of 159 sq. in./gal. at 40% fill volume. The comparable gas contact surface area-to-volume ratio of the one gallon high aspect ratio container (aspect ratio about 5:1) of the present invention is 31.4 sq. in./gal. at 40% fill volume. The lower gas contact surface-to-volume ratio is believed to reduce the dissolution rate of pressurizing gas into the source chemical as compared to a conventional one gallon container.

Thus, one unexpected result of the present invention is high aspect ratio chemical containers improve the performance of direct liquid injection delivery systems as compared to the same volume conventional container by limiting the dissolution rate of pressurizing gas into the CVD source chemical. By minimizing dissolved gas in the liquid being transferred, liquid flow controllers have improved stability and the uniformity of chemical delivery rates is substantially improved. No degassing steps or procedures are therefore necessary.

A third benefit of the present invention is the high aspect ratio chemical container provides a unique advantage over conventional containers, because higher canister packing densities are made possible with high aspect ratio containers. For example, using a conventional container in a two canister continuous chemical delivery system, a single chemical can be delivered from one system with a typical footprint of 28 in.×24 in. However, using high aspect ratio containers, two continuous delivery systems can be put into the same footprint. Thus, the present invention minimizes costly semiconductor cleanroom floorspace that is necessary to support the subject chemical delivery systems.

High aspect ratio chemical containers of the present invention are preferably all-welded containers fabricated from 316L Electropolished (EP) Stainless Steel (SS). Currently, many conventional all-welded containers also are fabricated from 316L SS. However, these conventional 316L SS containers are electropolished after fabrication. Electropolishing the containers requires large diameter openings in the container to insert the electrodes that are necessary for the electropolishing process. Post-electropolish inspection also is made difficult, because after fabrication, the interior surfaces cannot be observed directly. Optical inspection tools, such as a baroscope, must be used for visual inspection.

Therefore, to minimize these problems, the high aspect ratio chemical containers are fabricated from a section of seamless 316L SS EP tubing. Milled 316L SS EP end caps are welded to each end of the tubing. All components preferably have a low surface roughness which is desirable for ultrahigh purity CVD source chemicals. The top end cap has 316L tube stubs for the welding of inlet, outlet and refill valves to the container and a level sensor fitting also is welded inside the container before electropolishing. The end caps are machined to provide a means for welding the end caps to the tube section.

The welds joining the two end caps to the tube section locally destroy the EP finish. Therefore, the bottom end cap is welded to the tube section first and the weld is electropolished prior to the top end cap being added. This welding and electropolishing order allows the bottom end cap weld to be accessed with a large diameter concentric electrode.

After electropolishing the bottom weld, the top end cap is welded in place and a second electropolish step is completed to provide passivation to the final weld on the container. A specially designed electrode (<0.75" in diameter and >25" in length) is inserted into the container through the small diameter level sensor fitting and a local electropolish finish is applied to the weld zone. Surface analysis performed on the weld zone of the container has shown that the finish on the weld is equivalent to the end caps and tube sections.

The use of seamless tubing for the present high aspect ratio containers provides an additional advantage over conventional SS containers. Currently, all of the conventional SS containers supplied by U.S. producers of ultrahigh purity CVD source chemicals are believed to be fabricated by one of two methods:

1. The container body is machined from a solid rod of 316L SS (3.5 in., 5.5 in. or 6.5 in. diameters).

2. The container shell is formed by rolling 316L SS sheet stock into a cylinder and the seam is welded. The end caps are then welded to the cylinder.

Especially compared to the second method, the use of seamless tubing according to the teachings of this disclosure eliminates degradation of the surface finish caused by the cylinder forming operation and eliminates the weld seam to form the cylinder. While post-forming work can be done to remove tooling marks and surface roughness of the seam weld, this work adds time and expense to the container manufacturing process. Thus, the use of seamless tubing improves the quality of the final product and simplifies the manufacturing method at the same time.

The high aspect ratio containers described herein can be used in a variety of chemical delivery systems and the inlet, outlet and refill valves of the canisters can be modified to fit any system. Preferably, the present containers are used in high purity chemical delivery systems, such as the systems described in U.S. Pat. No. 5,562,132, which commonly owned patent is incorporated herein by reference. Those skilled in the art will recognize that the present high aspect ratio containers can be used as (a) a "bulk" canister, (b) a refillable ampule (process canister) to supply semiconductor fabrication equipment, such as a CVD reactor, or (c) both a bulk canister and a process canister in the same chemical delivery systems.

Figure 2:
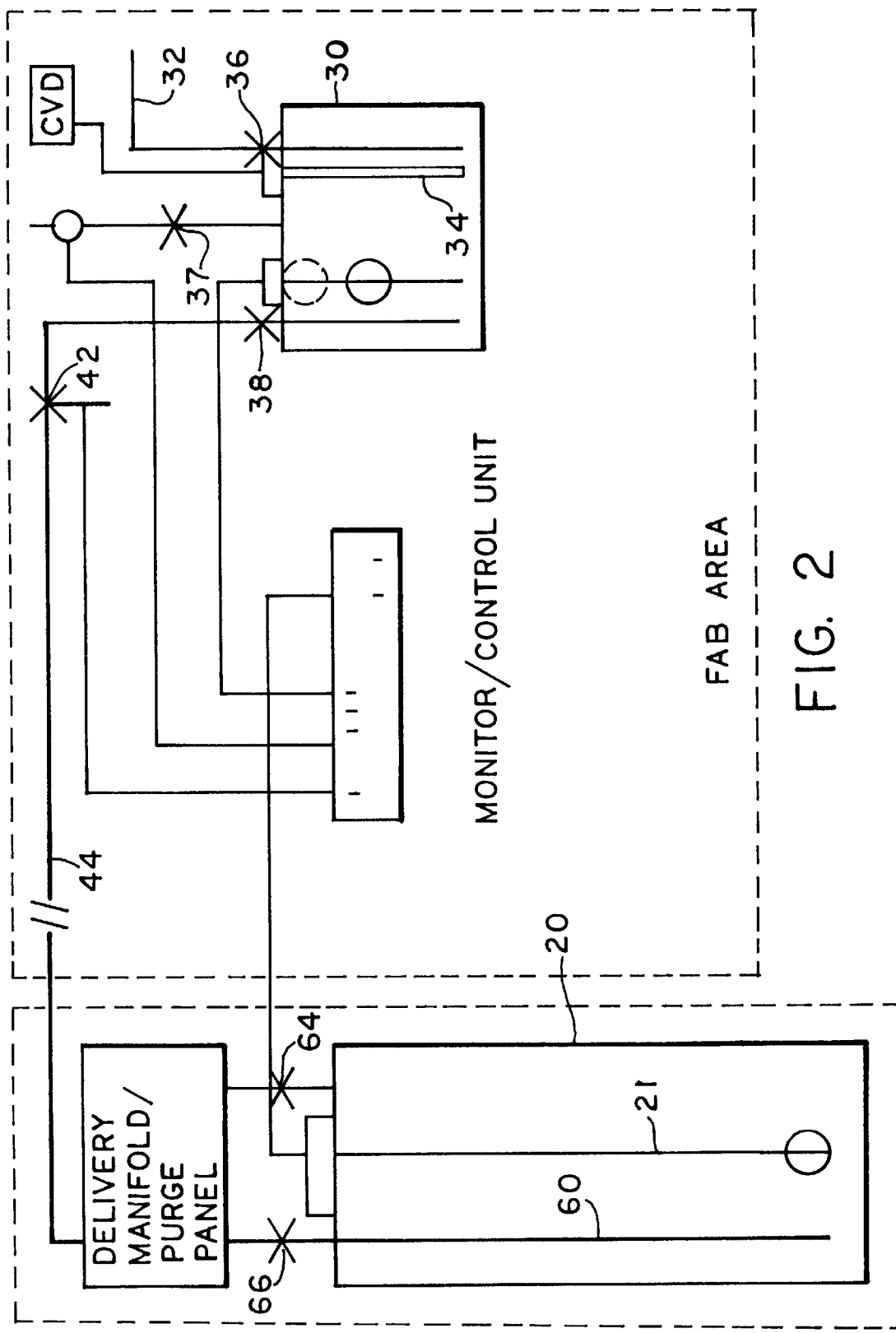
FIG. 2 shows a first chemical delivery system utilizing a high aspect ratio container of the present invention.

As an example of the use of the present containers, FIG. 2 shows a chemical delivery system that utilizes a bulk canister (20) and a process canister (30). Either or both of the canisters may comprise a high aspect ratio container constructed according to the present invention. The designation of "bulk" and "process" is simply to define the order of the canisters in the described chemical delivery system and is not intended to define the particular physical attributes of each canister.

The operation of the embodiment in FIG. 2 can be described as follows: The monitor/control unit (40) initiates the refill protocol by opening valve (42), which is preferably a pneumatically activated valve. Since bulk container (20) is continuously pressurized with an inert gas via inlet valve (64), when valve (42) is opened, high purity chemical in the container (20) is forced up the draw tube (60) through the outlet value (66) and is delivered to the process canister (30) via delivery line (44).

The bulk canister (20) preferably contains a level sensor system (21) for detecting the level of high purity chemical in the bulk container. The level sensor is typically incorporated on a separate structure (21). Preferably, a metallic level sensor that includes at least one two-pole read switch and at least one metallic float is used. However, depending upon the application, other level sensors such as capacitance probes or optical level sensors also may be used. The reader is directed to U.S. Pat. No. 5,562,132 for additional description of appropriate level sensors.

A level sensor system (21) also is included in the process canister (30) to generate signals that indicate the level of high purity chemical in the process canister (30). When the chemical level is low ("needs refill"), a refill signal is sent to a monitor/control unit (40) and the refill procedure is initiated. When the process canister (30) is filled, a high level signal is sent to the monitor/control unit (40) to stop the refill procedure. Those skilled in the art will recognize that the specific steps in the refill procedure can be performed manually or automatically. Additional specific refill procedures and steps are described in U.S. Pat. No. 5,562,132.

The process canister (30) also has a refill inlet valve (38) and a chemical outlet valve (36) which are connected to the top of the canister. Vacuum/pressurization valve (37) permits the process canister (30) to be pressurized with an inert gas during normal process operation. Outlet valve (36) connects the process canister (30) to a delivery line (32) that supplies the high purity chemical to the process tool. A separate level sensor (34) is shown in FIG. 2, although this level sensor is not necessary to practice the present invention.

Figure 3:
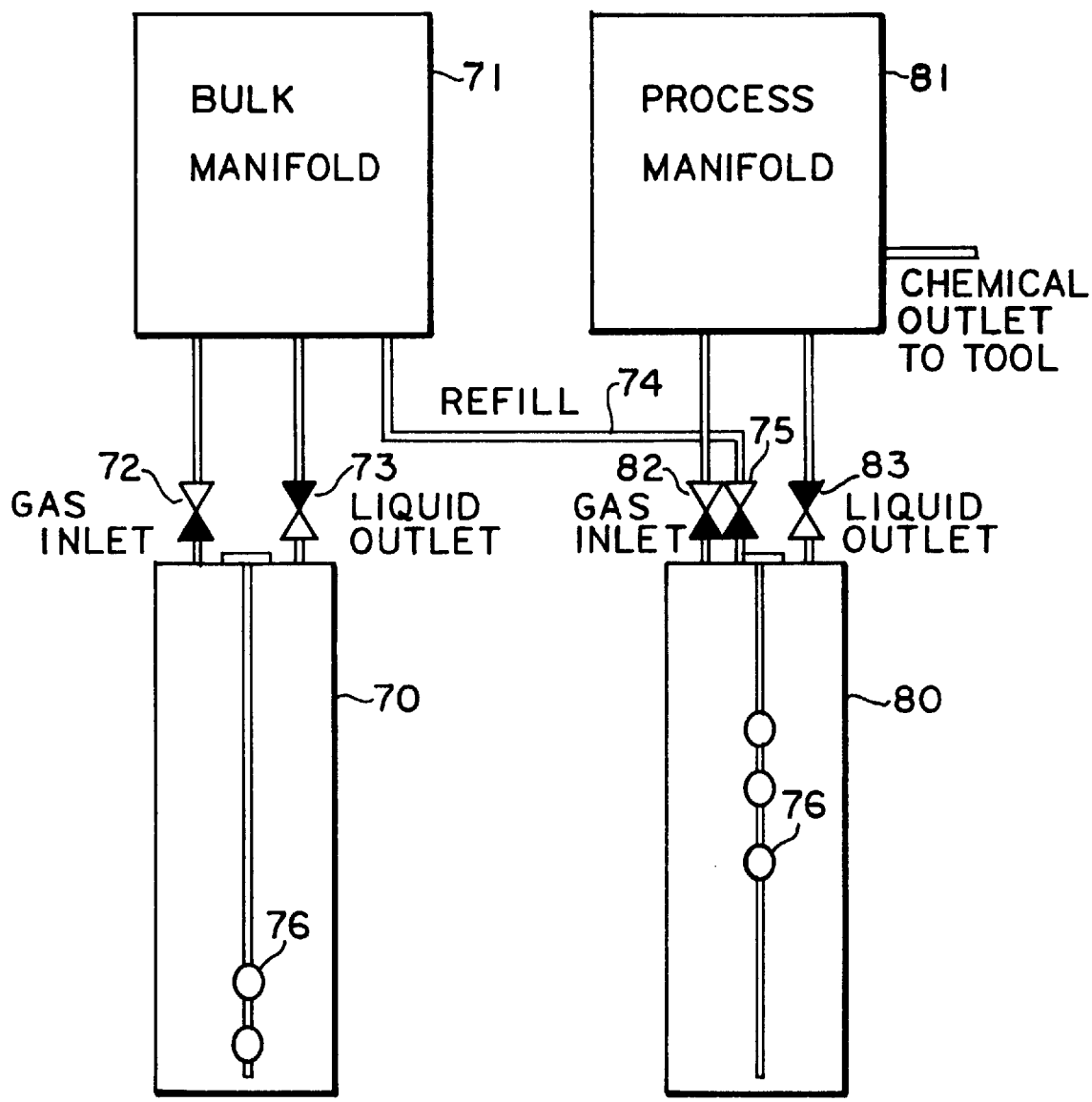
FIG. 3 shows a second chemical delivery system utilizing a high aspect ratio container of the present invention.

The present high aspect ratio containers also are appropriate for use in a two canister "bulk" delivery system. Referring to FIG. 3, a second chemical delivery system using two "bulk" canisters is shown. Either or both of these canisters may be constructed according to the teachings of the present invention.

The operation of the chemical delivery system of FIG. 3 can be described as follows: a bulk manifold (71) supplies inert gas under pressure to the first bulk canister (70) via a gas inlet (72). High purity chemical is forced out of the canister (70) via the liquid outlet (73) through a refill tube (74) and refill port (75) into the second bulk canister (80). Level sensors (76) are disposed within the bulk canisters to signal when the canisters require refilling. Further discussion of such level sensors can be found in the description of the previous example and in U.S. Pat. No. 5,562,132, which is incorporated herein by reference.

The second bulk canister (80) is operated in a similar manner as the first bulk canister (70). To dispense the high purity chemical to the process tool, the process manifold (81) communicates an inert gas under pressure to the second bulk canister (80) via the gas inlet (82). The high purity chemical is forced out of the second bulk canister (80) through the liquid outlet (83) and the process manifold (81) to the process tool.

By using the high aspect ratio containers of the present invention and maintaining at least about 40%, or more preferably 50%, fill volume in the canister, the liquid flow controller can accurately dispense the high purity chemical to the desired destination. Since dissolved gases in the liquid being transferred are minimized by these techniques, the need for degassing steps or apparatus is eliminated.

Although the invention has been described in connection with reference to preferred embodiments and specific examples, it will be readily understood by those skilled in the art that many modifications and adaptions of the inventions described herein are possible without departure from the spirit and scope of the invention as claimed hereafter.

We claim:

1. A canister for direct liquid injection of high purity chemicals to semiconductor fabrication process tools, comprising:

a cylindrical stainless steel container comprising an inlet and an outlet, wherein the container is formed by welding stainless steel electropolished end caps to seamless stainless steel electropolished tubing whereby the end caps form a top and bottom of the container, wherein the inlet and outlet are disposed in the top of the container, wherein a draw tube is in communication with the outlet and the draw tube extends to near the bottom of the container, wherein the container has a height-to-diameter ratio of between about 3:1 to about 6:1 and wherein a level sensor is disposed in the container and has a refill trigger point and a cable for communicating a refill signal from the level sensor to a refill indicator circuit when the volume of the high purity chemical is less than about 40% of the container volume.

2. A canister as in claim 1 wherein the height-to-diameter ratio is between about 4.5:1 to about 5.5:1.

3. A canister as in claim 2 wherein the level sensor initiates the refill signal when the high purity chemical is less than about 50% volume of the container.

4. A canister as in claim 1 wherein the height-to-diameter ratio is about 5:1.

5. A canister as in claim 4 wherein the level sensor initiates the refill signal when the high purity chemical is less than about 50% volume of the container.

6. A direct liquid injection system for delivery of high purity chemical to a semiconductor fabrication tool, comprising:

a first canister, wherein the first canister has a gas inlet and a liquid outlet and is a canister as in claim 1;

a first manifold, wherein the first manifold communicates pressurized gas to the gas inlet of the first canister;

a second canister, wherein the second canister has a gas inlet, a liquid outlet and a refill port;

a refill line, wherein the refill line communicates high purity chemical from the liquid outlet of the first canister to the refill port of the second canister; and a second manifold, wherein the second manifold communicates pressurized gas to the second canister and communicates the high purity chemical from the second canister to the semiconductor process tool.

7. A direct liquid injection system for delivery of high purity chemical to a semiconductor fabrication tool, comprising:

a first canister, wherein the first canister has a gas inlet and a liquid outlet;

a first manifold, wherein the first manifold communicates pressurized gas to the gas inlet of the first canister;

a second canister, wherein the second canister has a gas inlet, a liquid outlet and a refill port and is a canister as in claim 1;

a refill line, wherein the refill line communicates high purity chemical from the liquid outlet of the first canister to the refill port of the second canister; and a second manifold, wherein the second manifold communicates pressurized gas to the second canister and communicates the high purity chemical from the second canister to the semiconductor process tool.

8. A direct liquid injection system for delivery of high purity chemical to a semiconductor fabrication tool, comprising:

a first canister, wherein the first canister has a gas inlet and a liquid outlet and is a canister as in claim 1;

a first manifold, wherein the first manifold communicates pressurized gas to the gas inlet of the first canister;

a second canister, wherein the second canister has a gas inlet, a liquid outlet and a refill port and also is a canister as in claim 1;

a refill line, wherein the refill line communicates high purity chemical from the liquid outlet of the first canister to the refill port of the second canister; and a second manifold, wherein the second manifold communicates pressurized gas to the second canister and communicates the high purity chemical from the second canister to the semiconductor process tool.

9. A cylindrical, electropolished stainless steel container having a height-to-diameter ratio of at least about 3:1, wherein a level sensor is disposed in the container, wherein the stainless steel is seamless, wherein an inlet and an outlet are disposed in the top of the container and wherein a draw tube is in communication with the outlet and the draw tube extends to near the bottom of the container wherein the container is formed by welding stainless steel electropolished end caps to seamless stainless steel electropolished tubing whereby the end caps form a top and bottom of the container.

10. The canister of claim 9 wherein the height-to-diameter ratio is between about 4.5:1 and about 5.5:1.

11. The canister of claim 9 wherein the height-to-diameter ratio is less than about 6:1.

12. The canister of claim 9 containing a chemical that fills at least about 50% of the internal volume of the canister.

* * * * *